(12) United States Patent
Agarwal et al.

(10) Patent No.: US 7,538,593 B2
(45) Date of Patent: May 26, 2009

(54) CIRCUIT AND METHOD TO CONVERT A SINGLE ENDED SIGNAL TO DUPLICATED SIGNALS

(75) Inventors: Prabhat Agarwal, Calcutta (IN); Mayank Goel, Bangalor (IN); Pradip Mandal, Kharagpur (IN)

(73) Assignee: Infineon Technologies AG, Munich (DE)

( * ) Notice: Subject to any disclaimer, the term of this patent is extended or adjusted under 35 U.S.C. 154(b) by 82 days.

(21) Appl. No.: 11/710,270

(22) Filed: Feb. 23, 2007

(65) Prior Publication Data
US 2008/0204096 A1    Aug. 28, 2008

(51) Int. Cl.
*G06F 1/04* (2006.01)
(52) U.S. Cl. .................. 327/257; 327/258; 327/295
(58) Field of Classification Search .......... 327/257, 327/258, 295
See application file for complete search history.

(56) References Cited

U.S. PATENT DOCUMENTS

| 4,761,568 | A  | * | 8/1988 | Stronski  | 327/259 |
| 5,751,176 | A  | * | 5/1998 | Sohn et al. | 327/295 |
| 7,005,891 | B2 | * | 2/2006 | Lee | 326/86 |
| 7,348,911 | B2 | * | 3/2008 | Marais | 341/144 |

* cited by examiner

*Primary Examiner*—Kenneth B. Wells
(74) *Attorney, Agent, or Firm*—Slater & Matsil, L.L.P.

(57) ABSTRACT

A circuit to convert a single ended signal to differential signals is disclosed. The circuit has two paths with each of the two paths comprising a plurality of stages. The number of stages in each of the two paths is the same. A first path of the two paths includes a buffer stage and at least one inverter stage. A second path of the two paths includes at least two inverter stages. The buffer stage has a delay matched to that of a first inverter stage of the second path. The buffer stage comprises a first pair of transistors comprising a first transistor of a first category operatively connected to a first transistor of a second category with their channel connections being connected in series.

13 Claims, 3 Drawing Sheets

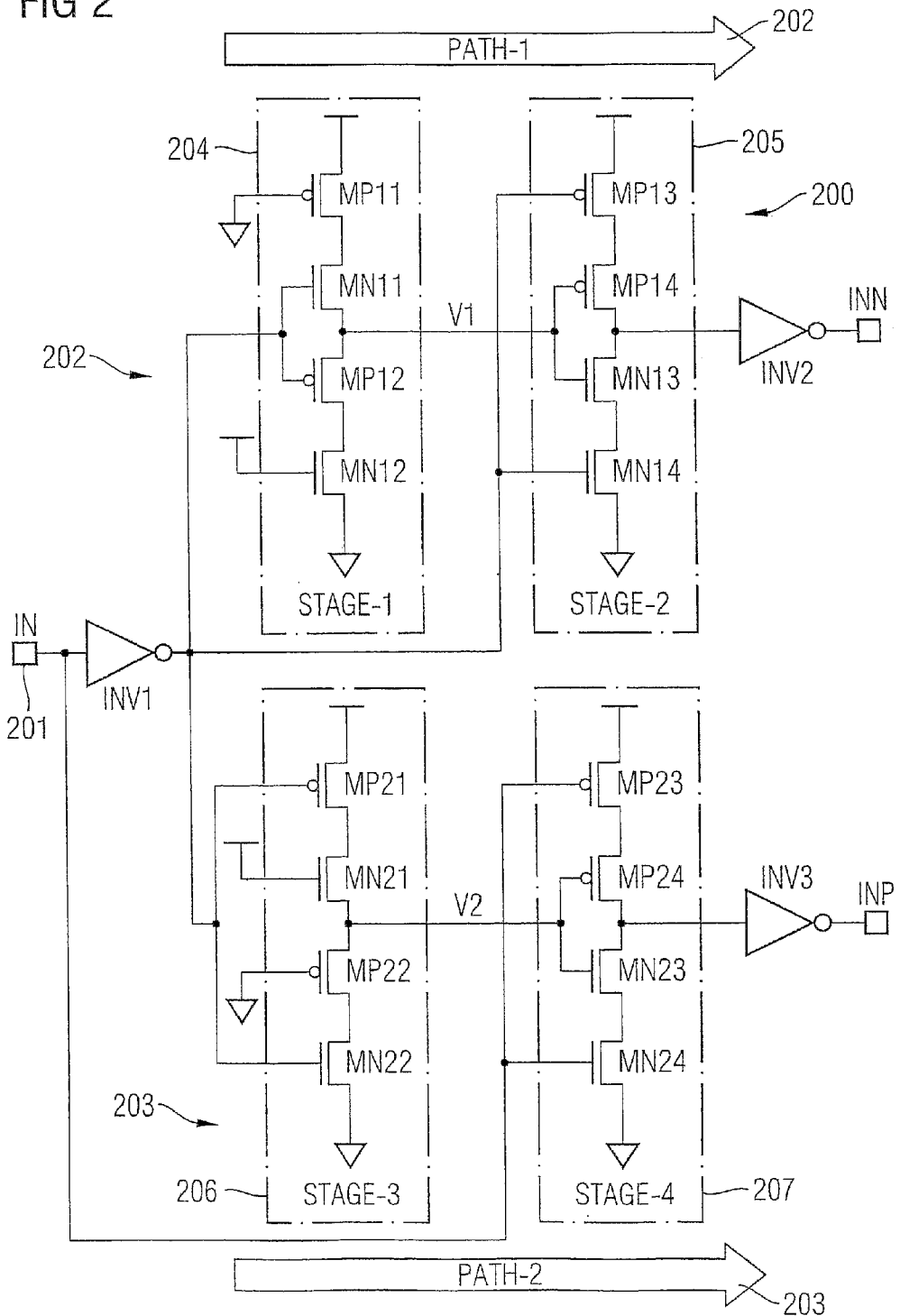

CIRCUIT AND METHOD TO CONVERT A SINGLE ENDED SIGNAL TO DUPLICATED SIGNALS

TECHNICAL FIELD

This invention relates to a circuit and method to convert a single ended signal to duplicated signals and relates more particularly, though not exclusively, to such a circuit and method having two paths, there being a buffer stage in one of the paths, the duplicated signals being differential signals.

BACKGROUND

Known circuits for converting a single ended signal to differential signals have the disadvantage that the load driven by the inverters must be small or else the number of stages in the inverters will have to be large. Also, the accurate matching of delays is difficult.

SUMMARY OF THE INVENTION

In accordance with an exemplary aspect there is provided a circuit to convert a single ended signal to differential signals, the circuit comprising two paths, a first path of the two paths comprising a buffer stage and at least one inverter stage, and a second path of the two paths comprising at least two inverter stages, the buffer stage having a delay matched to that of a first of the at least two inverter stages; the buffer stage comprising a first pair of transistors comprising a first transistor of a first category operatively connected to a first transistor of a second category with their channel connections being connected in series.

In accordance with another exemplary aspect there is provided a circuit to convert a single ended signal to differential signals, the circuit comprising at least two paths, each of the at least two paths comprising a plurality of stages with the number of stages in each of the at least two paths being the same; a first path of the at least two paths comprising at least one inverter stage and at least one buffer stage and a second path of the at least two paths comprising only inverter stages.

According to a further exemplary aspect there is provided a circuit to duplicate a signal and invert the duplicated signals, the circuit comprising two paths each configured to receive an input, each of the two paths comprising a plurality of stages with the number of stages in each of the two paths being the same, a first path of the two paths comprising at least one inverter stage and a buffer stage and a second path of the two paths comprising only inverter stages.

In accordance with yet a further exemplary aspect there is provided a method to convert a single ended signal to differential signals, the method comprising:
supplying the single ended signal to two paths;
in a first path of the two paths, buffering then inverting the single ended signal; and
in a second path of the two paths, performing at least two stages of inversion of the input signal.

BRIEF DESCRIPTION OF THE DRAWINGS

In order that the invention may be clearly understood and readily put into practical effect there shall now be described by way of non-limitative example only exemplary embodiments, the description being with reference to the accompanying illustrative drawings. In the drawings:

FIG. 2 is an illustration of an exemplary form of circuit to convert a single ended signal to differential signals.

DETAILED DESCRIPTION OF ILLUSTRATIVE EMBODIMENTS

Figure 1:
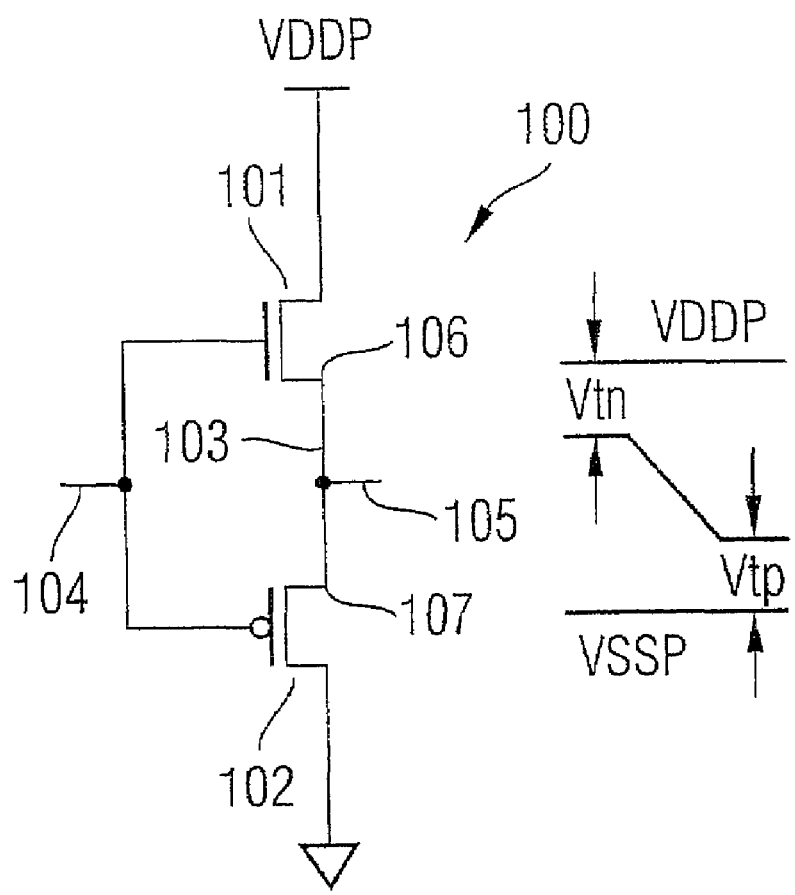
FIG. 1 is an illustration of an exemplary form of buffer stage and its output.

FIG. 1 shows an exemplary buffer stage 100 with a delay that is able to be matched to the delay of an inverter stage. The buffer stage 100 replaces an inverter in an inverter chain so that an opposite phase with matched delay can be obtained. As can be seen, buffer stage 100 comprises two transistors 101, 102 of different categories and having: their channel connections 106, 107 operatively connected in series at 103, a common input 104 to their gates, and a common output 105 from their operatively connected channel connections. Such a structure will be called a "joint" structure. As shown in FIG. 1 the transistors 101, 102 are an n-type transistor 101 and a p-type transistor 102, the sources 106, 107 being operatively connected. The two transistors 101, 102 are preferably back-biased transistors being an NMOS transistor 101 and a PMOS transistor 102. However as shown, the signal swing of the buffer stage 100 is not rail-to-rail and is limited by the threshold drop Vt of the transistors 101 and 102. This causes some current leakage in the next stage unless suitable measures are employed in that stage.

FIG. 2 shows an exemplary circuit 200 for providing differential signals from a single ended signal that may be the output of a single ended circuit (not shown). However, it may be used to generate signals other than differential signals. The output signal is input IN to the circuit 200 at 201. It is then inverted using a known inverter INV1. The output of inverter INV1 is then passed to two paths 202 and 203 that are electrically in parallel.

The first path 202 gives the out-of-phase signal INN and the second path 203 gives the in-phase signal INP. Each path 202, 203 comprises a plurality of stages—two as shown. The number of stages in each of the two paths 202, 203 is the same. More than two stages may be used in each path 202, 203 to cater for different loads.

In the first path 202 the first stage 204 is a buffer stage and includes the buffer circuit 100 operatively connected to the output of inverter INV1 and having NMOS transistor 101 and PMOS transistor 102 (marked as MN11 and MP12 respectively). The first stage 204 has two further transistors—a PMOS transistor MP11 and an NMOS transistor MN12. Transistors MP11 and MN12 are always ON so first stage 204 is, effectively, the buffer circuit 100. Transistors MP11 and MN11 together are the pull-up path of first stage 204. Similarly, transistors MP12 and MN12 together are the pull-down path for first stage 204.

The output swing of first stage 204 at V1 will be between Vtp and VDDP−Vtn (FIG. 1). Vtp and Vtn are the threshold voltages of back-biased transistors MN11 and MP12 respectively. If the output V1 were to be fed directly to another normal inverter INV2, there may be leakage currents in the inverter INV2 as the transistors MN11 and MP12 may not be fully OFF when V1 swings between its extremes. Therefore, the second stage 205 is provided to reduce the possibility of leakage even when the output V1 does not swing rail-to-rail.

Second stage 205 comprises four transistors, with the centre transistors being PMOS transistor MP14 and NMOS transistor MN13 in a joint structure as an inverter. In this case the drains of transistors MP14 and MN13 are operatively connected. PMOS transistor MP13 is operatively connected to PMOS transistor MP14, and NMOS transistor MN14 is operatively connected to MN13 and ground. So the two PMOS transistors MP13, MP14 are connected together, and the two NMOS transistors MN13, MN14 are connected together.

When V1 is at VDDP-Vtn (i.e. IN=0), the leakage path to VDDP is through transistor MP14 and is switched OFF by transistor MP13. Similarly, when V1 is at Vtp, the leakage path to ground is switched OFF by transistor MN14. The switching OFF of transistors MP13 and MN14 may be achieved by connecting the output of inverter INV1 to the gates of transistors MP13 and MN14.

As the output of second stage 205 can swing from rail-to-rail it can be fed into normal inverter INV2. Both leakage current and reduced swing are compensated for in second stage 205.

The second path 203 also has two stages 206 and 207, marked as the third stage 206 and fourth stage 207. The second path 203 could have been implemented with simple inverter stages but this would cause asymmetry in the delays due to the reduced swing and extra transistors in first path 202. Therefore, second path 203 has its swing limited by threshold drops. Third stage 206 therefore has four transistors—PMOS transistor MP21 and NMOS transistor MN22 being operatively connected to the output of inverter INV1 and providing the inversion function. PMOS transistor MP22 and NMOS transistor MN21 limit the swing on the lower and higher sides respectively. Their output, V2, is fed to the fourth stage 207.

The pull-down path of third stage 206 is transistors MP22 and MN22. These are topologically similar to transistors MP11 and MN11 that comprise the pull-up path of first stage 204. As such the pull-up timing characteristics of first stage 204 are similar to the pull-down timing characteristics of third stage 206. Similarly, transistors MP21 and MN21 are the pull-up path of third stage 206. These are topologically similar to transistors MP12 and MN12 of the pull-down path of first stage 204. Therefore, the pull-down timing characteristics of first stage 204 are similar to the pull-up timing characteristics of third stage 206.

The presence of transistors MP11 and MN12 in first stage 204 provides symmetry between first stage 204 and third stage 206.

Fourth stage 207 is exactly the same as second stage 205 and operates in exactly the same manner to achieve the same result—to stop the leakage paths and to provide full swing outputs. However, here the input signal IN is used to control the transistors MP23 and MN24 to allow for the phase difference. The output may be connected to a further standard inverter INV3.

As such, there is symmetry between first path 202 and second path 203, and there is matching of delays.

Figure 3A:
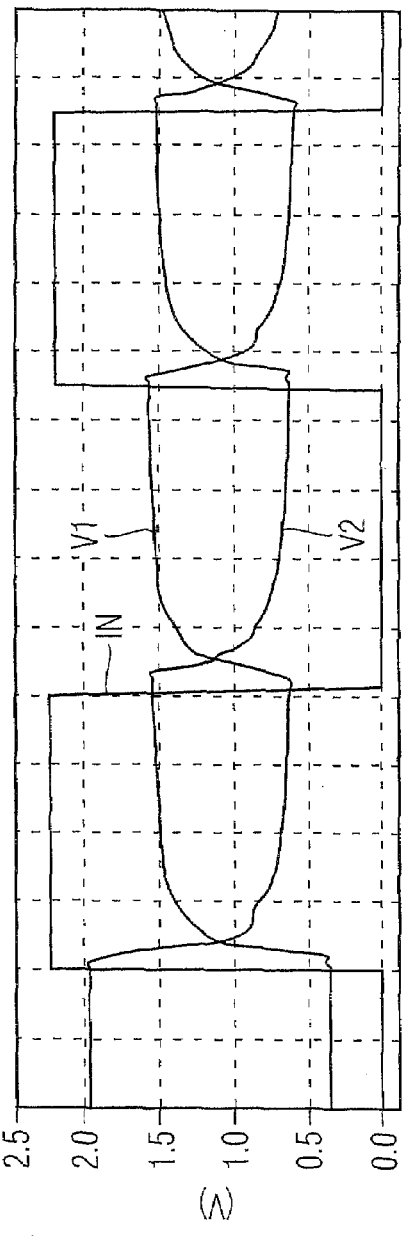
FIG. 3 is two graphs of node voltages for the circuit of FIG. 2.
Figure 3B:
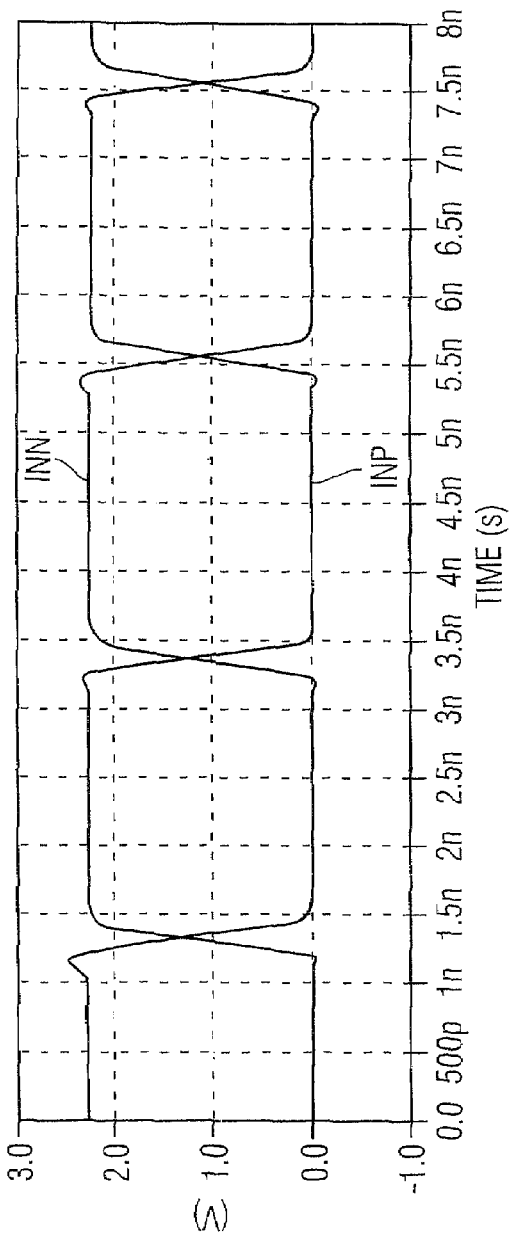

FIG. 3(a) shows the plots of voltages V1, V2 and the input IN. FIG. 3(b) shows the plots of the final output voltages INN and INP.

Whilst exemplary embodiments have been described in the foregoing description, it will be understood by those skilled in the technology concerned that many variations or modifications in details of design, construction or operation may be made without departing from the invention as defined in the following claims.

What is claimed is:

1. A circuit to provide duplicate signals of a signal and invert one of the duplicate signals, the circuit comprising two paths, each of the two paths comprising a plurality of stages with the number of stages in each of the two paths being the same; a first path of the two paths comprising a buffer stage followed by at least one inverter stage and a second path of the two paths comprising only inverter stages; the buffer stage comprising a first pair of transistors comprising a first transistor of a first category operatively connected to a first transistor of a second category with their channel connections being connected in series, wherein the at least one inverter stage is configured to have a high impedance output state if an input to the buffer stage and an input to the at least one inverter stage does not comprise the same logical state.

2. A circuit as claimed in claim 1, wherein the first transistor of the first category and the first transistor of the second category have their channel connections connected in series, a common input to their gates, and a common output from their operatively connected channel connections.

3. A circuit as claimed in claim 1, wherein the buffer stage has a delay matched to that of a first inverter stage of the second path; and the at least one inverter stage of the first path is the same as at least one second inverter stage of the second path.

4. A circuit as claimed in claim 1, wherein the first path is to generate an out-of-phase signal of the duplicated signals, and the second path is to generate an in-phase signal of the duplicated signals.

5. A circuit as claimed in claim 1, wherein the buffer stage further comprises a second pair of transistors comprising a second transistor of the first category operatively connected to the first transistor of the second category and a second transistor of the second category operatively connected to the first transistor of the first category.

6. A circuit as claimed in claim 1, wherein the first category of transistor is n-type transistor and the second category of transistor is p-type transistor, the channel connections being selected from the group consisting of: sources, and drains.

7. A circuit as claimed in claim 3 further comprising:
an input to receive the signal, the input being operatively connected to the at least one second inverter stage of the second path;
a first inverter operatively connected to the input, the first inverter output being operatively connected to:
the buffer stage,
a first inverter stage of the second path, and
the at least one inverter stage of the first path.

8. A circuit as claimed in claim 3, wherein the at least one inverter stage of the first path and the at least one second inverter stage of the second path each comprise a third transistor of the first category and a third transistor of the second category for inversion; and a fourth transistor of the first category connected to the third transistor of the first category, and a fourth transistor of the second category connected to the third transistor of the second category, to control leakage.

9. A circuit as claimed in claim 8, wherein for the first path the first inverter output is operatively connected to a gate of the fourth transistor of the first category and a gate of the fourth transistor of the second category.

10. A circuit as claimed in claim 8, wherein the third transistor of the first category and the third transistor of the second category each have an output operatively connected to a further inverter in each of the first path and the second path.

11. A circuit as claimed in claim 1, wherein the signal is a single ended signal, and the duplicated signals are differential signals.

12. A method to convert a single ended signal to differential signals, the method comprising:
supplying the single ended signal as an input signal to a first path and a second path;
the first path comprising a first stage and a second stage, the first stage comprising a first transistor of a first category operatively connected to a first transistor of a second category with their channel connections being connected in series;

the input signal being supplied to the first path by being supplied to the gates of the first transistor of the first category and the first transistor of the second category to buffer the input signal;

a common output from the operatively connected channel connections being supplied to the second stage of the first path to invert the common output in the second stage of the first path and to control current leakage and/or to output voltage swing;

performing two stages of inversion of the input signal in the second path and controlling current leakage and/or to output voltage swing; and outputting a differential signal comprised of an output from the first path and an output from the second path, wherein the input signal is inverted before being supplied to the two paths, the buffering in the first stage of the first path is with a delay substantially the same as the delay in a first stage inversion of the two stages of inversion of the second path, the inversion in the first path is substantially the same as a second of the two stages of inversion in the second path, the inverted signals are both further inverted, and the inverted input signal is used to control leakage resulting from the inversion in the first path and the input signal is used to control leakage in the second of the two stages of inversion in the second path.

13. A method to convert a single ended signal to differential signals, the method comprising:

supplying the single ended signal as an input signal to a first path and a second path;

the first path comprising a first stage and a second stage, the first stage comprising a first transistor of a first category operatively connected to a first transistor of a second category with their channel connections being connected in series;

the input signal being supplied to the first path by being supplied to the gates of the first transistor of the first category and the first transistor of the second category to buffer the input signal;

a common output from the operatively connected channel connections being supplied to the second stage of the first path to invert the common output in the second stage of the first path; and performing two stages of inversion of the input signal in the second path, wherein the input signal is inverted before being supplied to the two paths, the buffering in the first stage of the first path is with a delay substantially the same as the delay in a first stage inversion of the two stages of inversion of the second path, the inversion in the first path is substantially the same as a second of the two stages of inversion in the second path, the inverted signals are both further inverted, and the inverted input signal is used to control leakage resulting from the inversion in the first path and the input signal is used to control leakage in the second of the two stages of inversion in the second path.

* * * * *